(12) United States Patent
Yoriki

(10) Patent No.: US 11,216,151 B2
(45) Date of Patent: Jan. 4, 2022

(54) INFORMATION PROCESSING DEVICE AND INFORMATION PROCESSING METHOD

(71) Applicant: FUJI CORPORATION, Chiryu (JP)

(72) Inventor: Minoru Yoriki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 257 days.

(21) Appl. No.: 16/463,685

(22) PCT Filed: Nov. 29, 2016

(86) PCT No.: PCT/JP2016/085352
§ 371 (c)(1),
(2) Date: May 23, 2019

(87) PCT Pub. No.: WO2018/100620
PCT Pub. Date: Jun. 7, 2018

(65) Prior Publication Data
US 2021/0173546 A1 Jun. 10, 2021

(51) Int. Cl.
*G06F 3/0481* (2013.01)
*G06F 30/20* (2020.01)
(Continued)

(52) U.S. Cl.
CPC ...... *G06F 3/04815* (2013.01); *G06F 3/04845* (2013.01); *G06F 30/20* (2020.01);
(Continued)

(58) Field of Classification Search
CPC .. G06F 3/04815; G06F 30/20; G06F 3/04845; G06T 17/00; G06T 19/20; G06T 2219/2016
See application file for complete search history.

(56) References Cited

U.S. PATENT DOCUMENTS 9,911,228 B2 * 3/2018 Pershing ............... G06T 17/20
2008/0247636 A1 * 10/2008 Davis ................... G06T 19/00
382/152
(Continued)

FOREIGN PATENT DOCUMENTS

JP   3-42780 A   2/1991
JP   8-106550 A  4/1996
(Continued)

OTHER PUBLICATIONS

International Search Report dated Feb. 21, 2017 in PCT/JP2016/085352 filed Nov. 29, 2016.
(Continued)

*Primary Examiner* — David T Welch
(74) *Attorney, Agent, or Firm* — Oblon, McClelland, Maier & Neustadt, L.L.P.

(57) ABSTRACT

An information processing device is an information processing device configured to be used in a processing system including a processing device configured to perform predetermined processing on a three-dimensional processing target, the information processing device including: a control section configured to acquire 3D data of the processing target; display the processing target on a three-dimensional object display screen in a three-dimensional shape, being capable of being moved, rotated, scaled up, and scaled down, based on the acquired 3D data; acquire designation information of a position on a surface of the processing target; and output positional inclination information based on the 3D data, the positional inclination information including information relating to a coordinate of the position and an inclination of the surface of the processing target corresponding to the acquired designation information.

5 Claims, 5 Drawing Sheets

(51) Int. Cl.
    *G06F 3/0484*    (2013.01)
    *G06T 17/00*     (2006.01)
    *G06T 19/20*     (2011.01)

(52) U.S. Cl.
    CPC .............. *G06T 17/00* (2013.01); *G06T 19/20*
            (2013.01); *G06T 2219/2016* (2013.01)

(56) References Cited

U.S. PATENT DOCUMENTS

| | | | |
|---|---|---|---|
| 2010/0182312 A1 | 7/2010 | Mitani et al. | |
| 2012/0001908 A1* | 1/2012 | Kikuta | G06T 17/20 345/419 |
| 2016/0324006 A1* | 11/2016 | Vetter | B33Y 80/00 |
| 2020/0286290 A1* | 9/2020 | Averianov | G06T 19/006 |

FOREIGN PATENT DOCUMENTS

| | | |
|---|---|---|
| JP | 11-272892 A | 10/1999 |
| JP | 2006-26790 A | 2/2006 |

OTHER PUBLICATIONS

UNISYS Jisedai Togo CAD/CAM System Cadceus V6 Training Modeling, Nihon Unisys, Ltd., Jun. 2003, pp. 5-11 to 5-14.

Extended European Search Report dated Nov. 13, 2019 in European Patent Application No. 16923078.6, 8 pages.

Pfeffer, M. et al. "3D-Assembly of Molded Interconnect Devices with Standard SMD Pick & Place Machines Using an Active Multi Axis Workpiece Carrier", IEEE International Symposium on Assembly and Manufacturing (ISAM), XP031955956, May 25, 2011, 6 pages.

* cited by examiner

INFORMATION PROCESSING DEVICE AND INFORMATION PROCESSING METHOD

TECHNICAL FIELD

The present disclosure relates to an information processing device and an information processing method.

BACKGROUND ART

In the related art, as an information processing device, for example, an information processing device has been proposed, in which three-dimensional shape data of a target as a work target is obtained from a CAD or the like, a target image is displayed on a display screen in a coordinate system set for the three-dimensional shape data together with setting a viewpoint, and two-dimensional image data of the target viewed from the viewpoint is used as a teaching model (for example, see Patent Document 1). In the device, since the teaching model can be obtained from the CAD data, the teaching model can be readily obtained without using a robot or a camera.

PATENT LITERATURE

Patent Document 1: JP-A-2006-026790

BRIEF SUMMARY

Technical Problem

Incidentally, in recent years, in a mounting device for mounting a component on a board, in addition to disposing the component on a planar board, a need for mounting the component on a more complicated three-dimensional object having a planar surface and a curved surface has increased. However, regarding a technique for mounting the component on the three-dimensional object, which is still at an initial stage, the mounting device for mounting the components on a three-dimensional object having a complicated shape do not still exist, and an established method such as data generation of an arrangement position of the components does not exist. Although it is necessary to set a position on the surface of such a three-dimensional object, at which the component is disposed, there is a problem that it becomes more difficult to acquire information of the arrangement position in case of a shape of the three-dimensional object being more complicated.

The present disclosure has been made in view of such problems, and a main target thereof is to provide an information processing device and an information processing method that can more readily acquire position information of a surface of a three-dimensional object.

Solution to Problem

The present disclosure employs following means in order to achieve the above-described main target.

An information processing device disclosed in the present specification is an information processing device configured to be used in a processing system including a processing device configured to perform predetermined processing on a three-dimensional processing target, the information processing device comprising: a control section configured to acquire 3D data of the processing target; display the processing target on a three-dimensional object display screen in a three-dimensional shape, which is capable of being moved, rotated, scaled up, and scaled down, based on the acquired 3D data; acquire designation information of a position on a surface of the processing target; and output positional inclination information based on the 3D data, the positional inclination information including information relating to a coordinate of the position and an inclination of the surface of the processing target corresponding to the acquired designation information.

In the device, 3D data of the processing target is acquired, and the processing target is displayed on the three-dimensional object display screen in the three-dimensional shape that can be moved, rotated, scaled up, and scaled down based on the acquired 3D data. Further in the device, the designation information of the position on the surface of the processing target is acquired, and the positional inclination information is output based on the 3D data, including the information relating to the coordinate of the position and the inclination of the surface on the processing target corresponding to the acquired designation information. As described above, since the positional inclination information of the designated position is output based on the 3D data, the position information of the surface of the three-dimensional object can be more readily acquired.

DESCRIPTION OF EMBODIMENTS

Figure 1:
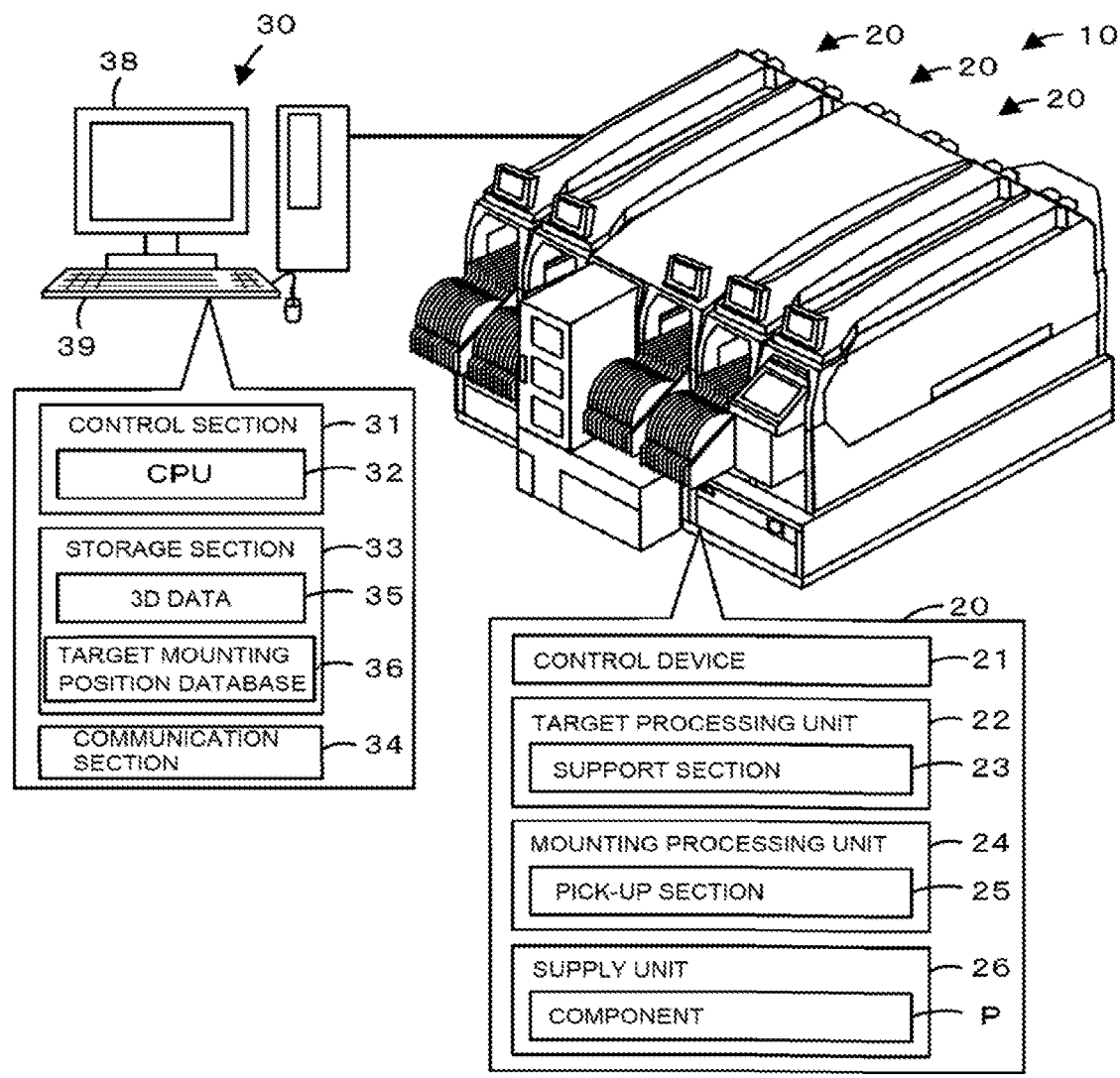
FIG. 1 is a schematic explanatory diagram of mounting system 10.
Figure 2:
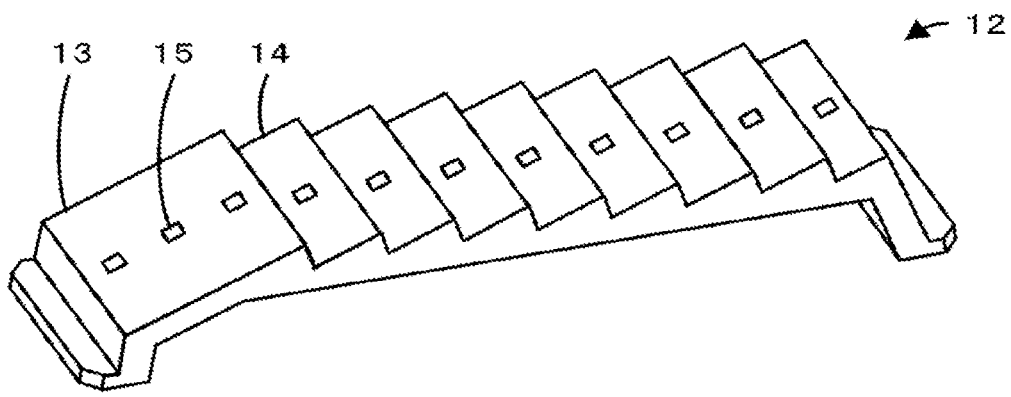
FIG. 2 is a schematic explanatory diagram of mounting target 12 on which component P is mounted.
Figure 3:
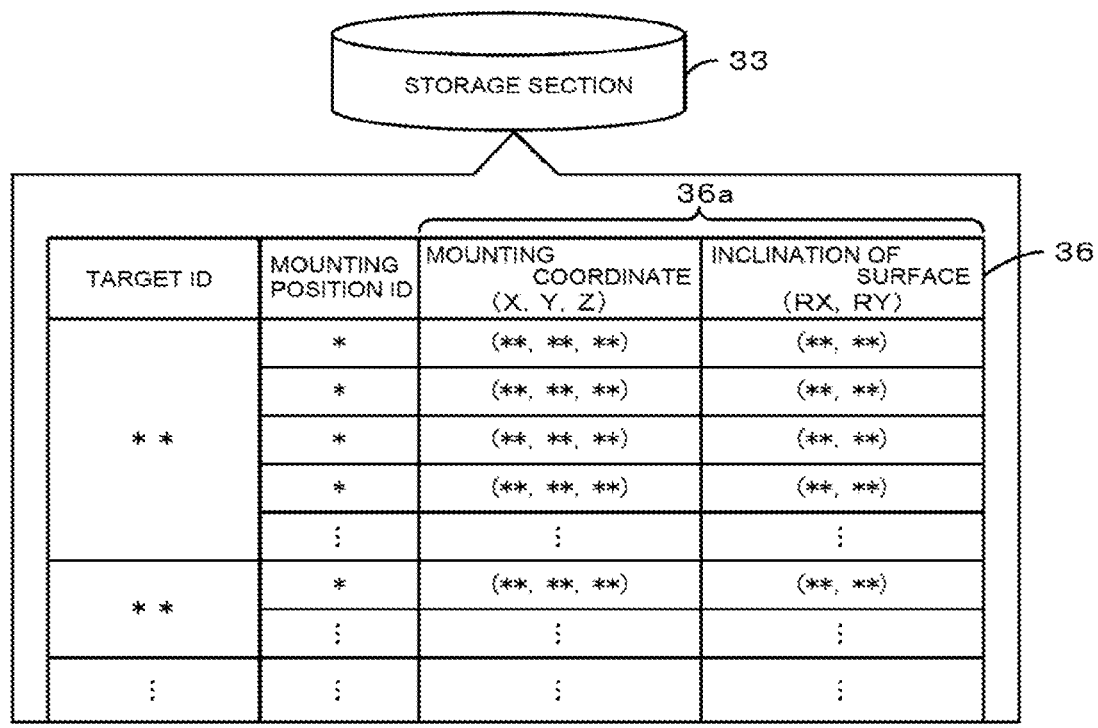
FIG. 3 is an explanatory diagram of target database 36 stored in storage unit 33.

The present embodiment will be described below with reference to the drawings. FIG. 1 is a schematic explanatory diagram of mounting system 10 that is an example of the present disclosure. FIG. 2 is a schematic explanatory diagram illustrating an example of mounting target 12 on which component P is mounted. FIG. 3 is an explanatory diagram illustrating an example of target database 36 stored in storage section 33. Mounting system 10 includes multiple mounting devices 20 for mounting component P on mounting target 12 such as a board or a three-dimensional object (see FIG. 2), and information processing device 30 for managing information relating to processing in mounting device 20. Mounting system 10 is configured as a mounting line, in which multiple mounting devices 20 are connected to perform mounting processing of various components P, and mounting target 12 is conveyed and component P is mounted.

Mounting target 12 is a three-dimensional object, and a component or the like is mounted at any position on a surface of mounting target 12. Mounting target 12 illustrated in FIG. 2 is an example thereof; however, mounting target 12 has stepped mounting surface 13, stepped mounting surface 14, or the like, and on such a surface, mounting position 15

(arrangement position) at which component P is disposed is regulated. Mounting target 12 has a shape in which mounting surface 13 and mounting surface 14 are inclined with respect to a horizontal surface when mounting target 12 is placed on the horizontal surface. In addition, in a state in which mounting target 12 is placed on the horizontal surface, mounting position 15 of mounting surface 13 and mounting position 15 of mounting surface 14 and the like are different from each other in height. In mounting target 12, mounting surfaces 13, 14 may be curved surfaces, and mounting position 15 may be any of upper surface side, a side surface side, and a lower surface side.

Mounting device 20 is a device for mounting component P on mounting target 12, and includes control device 21, target processing unit 22, mounting processing unit 24, and supply unit 26. Control device 21 is configured as a microprocessor in which a CPU is a main section, and includes a ROM for storing a processing program, a RAM used as a work area, or the like. Target processing unit 22 is a unit capable of conveying mounting target 12 and adjusting and fixing an inclination angle of mounting target 12. Target processing unit 22 includes support portion 23 for fixing mounting target 12. Mounting processing unit 24 is a unit for picking up and dispose component P, and includes, for example, a mounting head, pick-up section 25 mounted on the mounting head, and a head moving section for moving the mounting head in the XY direction. Pick-up section 25 may be, for example, a suction nozzle for picking up component P by pressure, a mechanical chuck for pinching and picking up component P, or the like. Supply unit 26 is a unit for supplying component P to mounting processing unit 24, and includes a reel on which a tape accommodating component P is wound, a tray on which component P is placed, or the like.

As illustrated in FIG. 1, information processing device 30 includes control section 31, storage section 33, communication section 34, display 38, and input device 39. Control section 31 is configured as a microprocessor in which CPU 32 is a main section. Storage section 33 is a device such as an HDD for storing various data such as a processing program. Storage section 33 stores 3D data 35 and target data base 36. 3D data 35 is data including information of a three-dimensional structure of the three-dimensional object such as mounting target 12 created by a CAD, for example. 3D data 35 includes, for example, a three-dimensional coordinate (X, Y, Z) with a predetermined origin as a reference, and information relating to the direction (for example, normal vector) of an outer surface in the coordinate. Target database 36 is a set of data regulating mounting position 15 of the three-dimensional object such as mounting target 12, which is the target of the mounting processing. As illustrated in FIG. 3, target database 36 includes identification information (ID) of the mounting target, mounting position ID of the mounting target, and positional inclination information 36a including a mounting coordinate (X, Y, Z), and inclination RX of an object surface of the mounting position due to a rotation about the X-axis direction and inclination RY due to a rotation about the Y-axis direction, or the like. Based on target database 36, information processing device 30 creates mounting job information relating to component P to be disposed by mounting device 20, the disposition position, disposition order or the like. Communication section 34 is an interface for exchanging an electrical signal with an external device. Display 38 is a liquid crystal screen for displaying various information. Input device 39 includes a keyboard, a mouse, and the like through which an operator inputs various commands.

Figure 4:
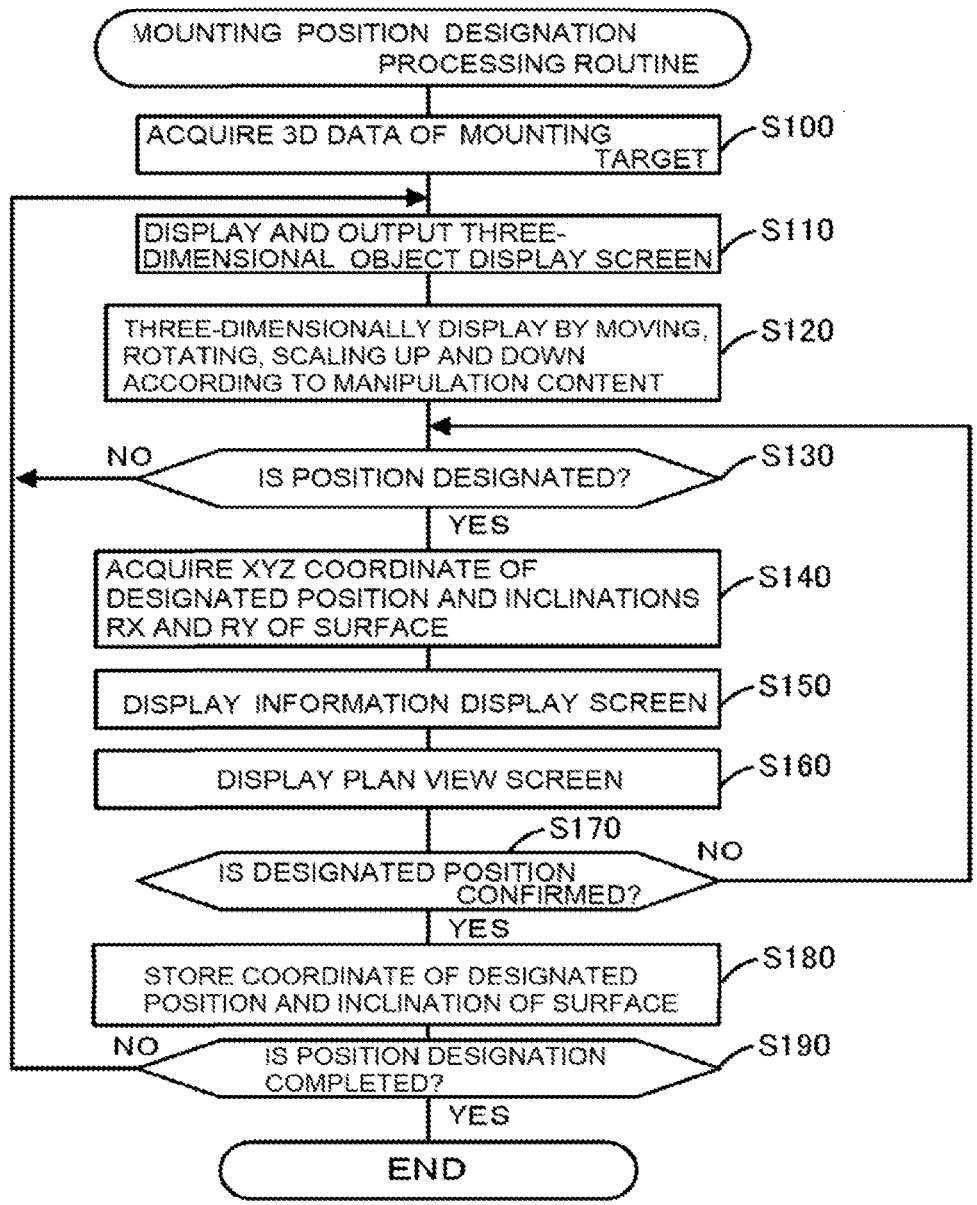
FIG. 4 is a flowchart illustrating an example of a mounting position designation processing routine.

Next, an operation of mounting system 10 of the present embodiment configured as described above, in particular, the processing when mounting position 15 of mounting target 12 is set by the operator who manipulates information processing device 30 will be described. FIG. 4 is a flowchart illustrating an example of a mounting position designation processing routine. The routine is stored in storage section 33 and executed based on a start instruction by the operator. When the routine is started, CPU 32 of control section 31 acquires the 3D data of mounting target 12 by reading 3D data 35 (S100). Next, CPU 32 displays and outputs three-dimensional object display screen 40 on display 38 (S110).

Figure 5:
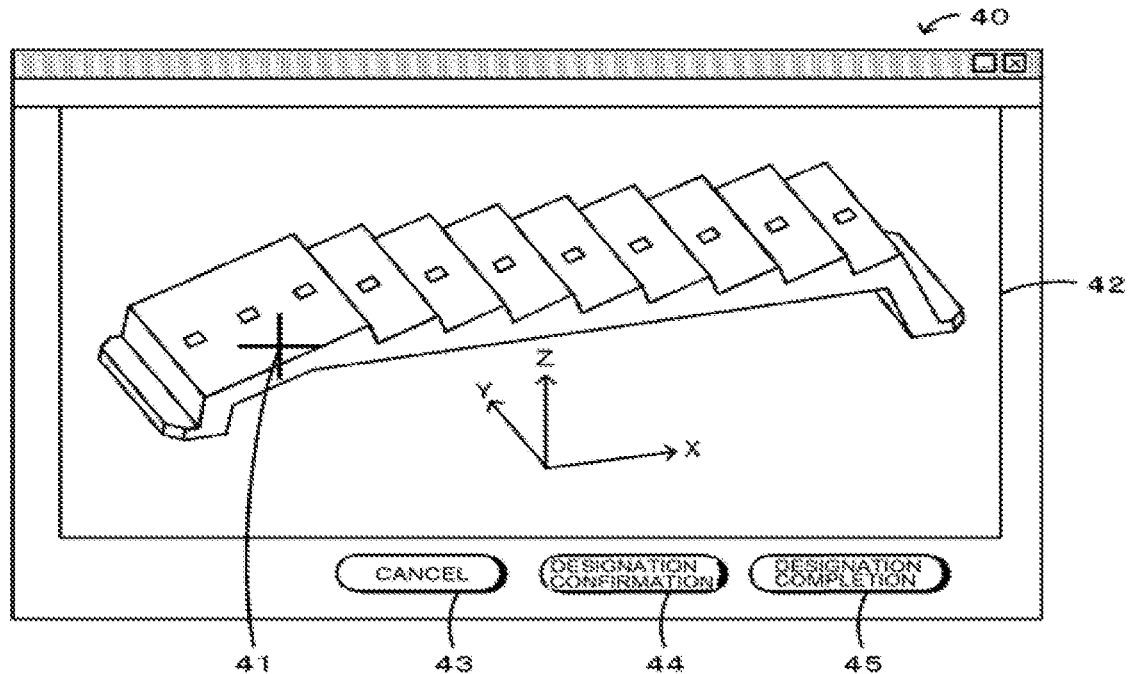
FIG. 5 is an explanatory diagram of three-dimensional object display screen 40.

FIG. 5 is an explanatory diagram of three-dimensional object display screen 40. Three-dimensional object display screen 40 is a screen for displaying mounting target 12, which is the three-dimensional object, on a plane based on 3D data 35. On three-dimensional object display screen 40, there arranged cursor 41 for designating a position and an input content, three-dimensional object display field 42 for displaying mounting target 12, cancel key 43 for canceling an instruction, confirmation key 44 for confirming a position designation, completion key 45 which is pressed after the designation of all of the mounting positions, and the like. In three-dimensional object display screen 40, when mounting target 12 displayed in three-dimensional object display field 42 is dragged and moved in accordance with a mouse operation of input device 39, mounting target 12 is three-dimensionally rotated, moved, scaled up, or scaled down. Since a method of displaying such a three-dimensional object is well known, a detailed description thereof will be omitted here. In three-dimensional object display screen 40, for example, when cursor 41 is disposed on mounting target 12 in three-dimensional object display field 42 and double-clicked, the position is temporarily designated, and when confirmation key 44 is pressed, the designation is confirmed. The operator manipulates the three-dimensional object displayed in three-dimensional object display field 42 with input device 39. The coordinate axes (X axis, Y axis, and Z axis) serving as a reference for mounting target 12 are as illustrated in FIG. 5.

Next, CPU 32 acquires the operation content on three-dimensional object display screen 40, adds one or more of the moving processing, rotating processing, scaling-up processing, and scaling-down processing to mounting target 12 according to the manipulation content, and performs the display on three-dimensional object display field 42 (S120). Next, CPU 32 determines whether the position has been designated based on the manipulation of input device 39 (S130), and executes the processing of S100 and the subsequent processing when the position is not designated. On the other hand, when the position is designated, CPU 32 acquires the coordinate of the designated position and the inclination of the outer surface from 3D data 35 (S140), displays and outputs information display screen 50 on display 38 (S150), and displays and outputs plan view screen 60 (S160). Here, CPU 32 acquires the position on the surface of mounting target 12 designated by the operator on three-dimensional object display screen 40 as designation information. Next, CPU 32 acquires the coordinate, in which the position is designated by the designation information, based on 3D data 35. At this time, CPU 32 acquires the coordinate in which the position is designated as the XYZ coordinate corresponding to the designated position on the display image in three-dimensional object display field 42. The origin of the XYZ coordinate is set at any position in 3D data 35. Further, CPU 32 obtains inclination RX of the outer surface due to the rotation about the X-axis direction and inclination RY due to the rotation about the Y-axis direction, from the outer surface vector of the corresponding coordinate (for example, normal vector) based on 3D data 35. The XYZ coordinate is regulated as an XY plane is set to be a horizontal plane on which mounting target 12 is placed, the X axis is set to be the longitudinal direction of mounting target 12, the Y axis is set to be the width direction of mounting target 12, and the Z axis is set to be the vertical direction.

Figure 6:
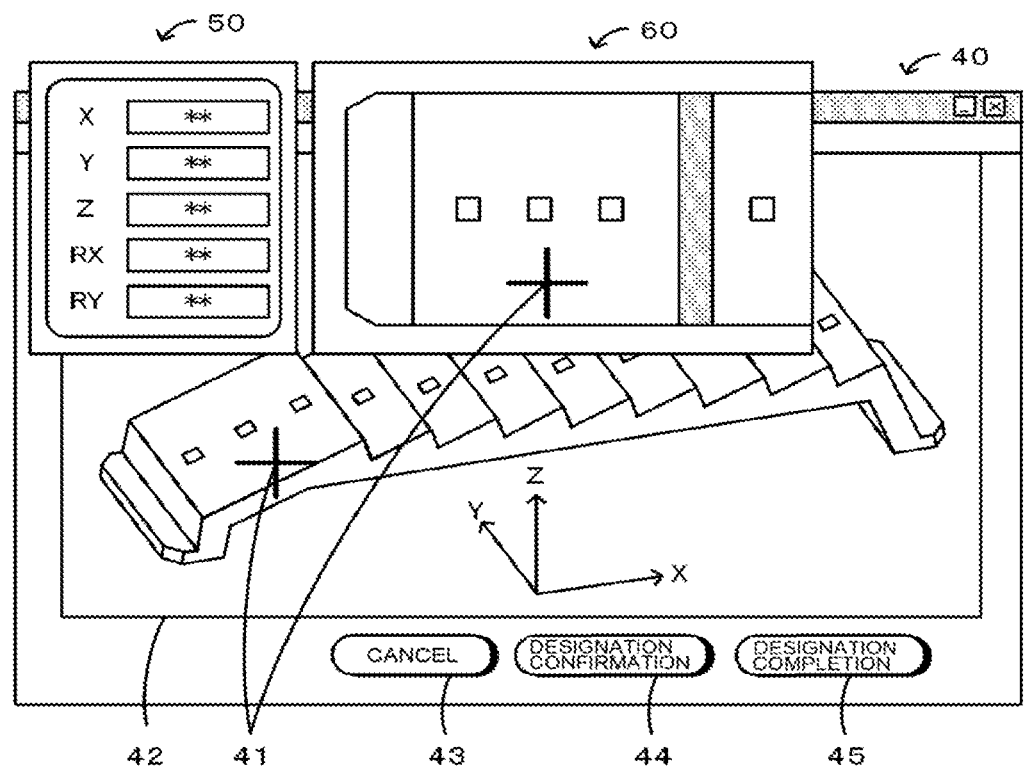
FIG. 6 is an explanatory diagram of information display screen 50 and plan view screen 60.

FIG. 6 is an explanatory diagram illustrating an example of information display screen 50 and plan view screen 60 displayed together with three-dimensional object display screen 40. Information display screen 50 is a screen for displaying positional inclination information 36a relating to the coordinate value of the outer surface of mounting target 12 and the inclination of the outer surface, which are temporarily designated. The coordinate value and the inclination of the outer surface are values obtained by CPU 32 based on 3D data 35, as described above. Information display screen 50 includes an X-value display column, a Y-value display column, a Z-value display column, an RX-value display column, an RY-value display column, and the like. Plan view screen 60 is a screen for displaying a plan view including the position temporarily designated on the surface of mounting target 12 in three-dimensional object display screen 40. On plan view screen 60, cursor 41 is displayed at the same position on mounting target 12 as that of three-dimensional object display screen 40. The operator can perform a finer position adjustment to designate the position by moving cursor 41 on plan view screen 60. In particular, it is easier for the operator to designate the position on the plan view than on the three-dimensional object. In FIG. 6, information display screen 50 and plan view screen 60 are displayed on three-dimensional object display screen 40 in a superimposed manner; however, at least one of information display screen 50 and plan view screen 60 may be disposed at a position on display 38 which is not superimposed on three-dimensional object display screen 40, or may be freely movable. Alternatively, at least one of information display screen 50 and plan view screen 60 may be disposed and displayed inside three-dimensional object display screen 40. The operator can check the information of the designated position by checking information display screen 50 and the plan view screen 60.

Next, CPU 32 determines whether the designated position has been confirmed based on whether or not confirmation key 44 has been clicked (S170). When the designated position is not confirmed, CPU 32 performs the processing of S130 and the subsequent processing including a clicking of cancel key 43 or the like. On the other hand, when the designated position is confirmed, CPU 32 stores the information relating to the coordinate of the designated position and the inclination of the surface in target mounting position data base 36 (S180). Then, CPU 32 determines whether the position designation has been completed based on a presence or absence of a clicking of completion key 45 (S190), and when the position designation is not completed, CPU 32 executes the processing of S110 and the subsequent processing. On the other hand, when the position designation is completed, CPU 32 ends the routine as it is. Accordingly, the operator can designate mounting position 15 while moving or rotating the three-dimensional image of mounting target 12 in the three-dimensional object display screen 40, and can readily acquire information such as the coordinate and the inclination of the surface thereof.

Figure 7:
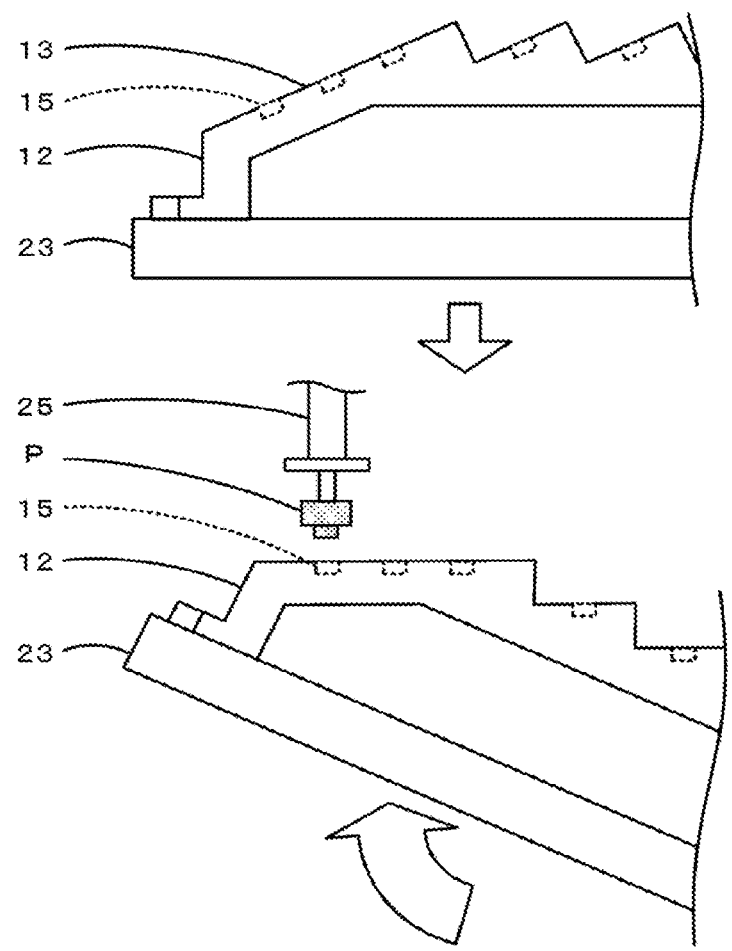
FIG. 7 is an explanatory diagram illustrating component P mounted by correcting an inclination of the mounting target 12.

Next, mounting processing of disposing component P at mounting position 15 of mounting target 12 using object mounting position database 36 set accordingly will be described. FIG. 7 is an explanatory diagram illustrating component P mounted by correcting the inclination of mounting target 12. Control device 21 of mounting device 20 fixes mounting target 12 to support section 23 by target processing unit 22 (see upper part of FIG. 7). Next, control device 21 adjusts the inclination of support portion 23 by the inclinations RX and RY such that mounting position 15 of mounting target 12 becomes horizontal, based on the information of mounting target 12 included in target mounting position database 36. Subsequently, control device 21 causes pick-up section 25 to pick up component P from supply unit 26, moves component P to an upper side of mounting position 15, and disposes component P at mounting position 15 (see lower part of FIG. 7). In this manner, in mounting device 20, component P is disposed in a state in which the inclination of mounting surface 13 of mounting target 12 is corrected, so that the mounting processing can be more reliable.

Here, the respective relationships between the constituent elements of the present embodiment and the constituent elements of the present disclosure will be clarified. Control section 31 of the present embodiment corresponds to a control section, and mounting target 12 corresponds to a processing target.

Three-dimensional object display screen 40 corresponds to a three-dimensional object display screen, information display screen 50 corresponds to an information display screen, and plan view screen 60 corresponds to a plan view screen. In the present embodiment, an example of an information processing method of the present disclosure is also clarified by explaining the operation of information processing device 30.

Information processing device 30 of the above described present embodiment acquires 3D data 35 of mounting target 12, and displays mounting target 12 on three-dimensional object display screen 40 in a three-dimensional shape, which is capable of being moved, rotated, scaled up, and scaled down, based on acquired 3D data 35. Further, information processing device 30 acquires the designation information of the position on the surface of mounting target 12, and outputs positional inclination information 36a based on the 3D data, which is relating to the coordinate of the position on mounting target 12 and the inclination of the surface corresponding to the acquired designation information. As described above, in information processing device 30, since positional inclination information 36a of the designated position is output based on 3D data 35, it is possible to more readily acquire the position information of the surface of the three-dimensional object. In the mounting target having the various three-dimensional shapes, a great number of man-hours of manual teaching such as inclining mounting target 12 in an actual machine, and of designating a coordinate parameter are typically required. On the other hand, in information processing device 30, since positional inclination information 36a is output by the designation on three-dimensional object display screen 40, it is possible to readily set the mounting position of the mounting target 12, and it is possible to significantly reduce the man-hours of creating the mounting job. Further, in information processing device 30, it is unnecessary to use the actual machine to acquire the coordinate parameter, so that it is possible to prevent the device and the mounting target from being damaged due to a mechanical interference during the teaching operation.

In addition, since control section 31 displays information display screen 50 for displaying the information relating to the coordinate and the inclination of the surface obtained based on 3D data 35, the operator can check the information of the position on the surface and the inclination of the three-dimensional object by the information display screen. Further, since control section 31 acquires the position on the surface of mounting target 12 designated by the operator on three-dimensional object display screen 40 as the designation information, the operator can designate the position on three-dimensional object display screen 40. Furthermore, when the position on the surface of mounting target 12 is designated on three-dimensional object display screen 40 by the operator, control section 31 displays the plan view including the designated position on the plan view screen 60. In the device, it is easy for the operator to understand the designated position by the plan view screen 60. In addition, since control section 31 acquires a position that is further designated by the operator on the plan view screen 60, the operator can set a position on the plan view in more detail. Since information processing device 30 is used in mounting device 20, it is possible to more readily obtain information of the arrangement position of the surface of the three-dimensional object in the mounting processing for disposing the component in the three-dimensional object.

It is needless to say that the information processing device of the present disclosure is not limited in any way to the above-described embodiment, and any embodiment can be implemented in various modes as long as the embodiment belongs to the technical scope of the present disclosure.

For example, in the above described embodiment, information display screen 50 and the plan view screen 60 are displayed and output; however, either one or both may be omitted. Also in information processing device 30, since positional inclination information 36a is output, it is possible to more readily acquire the position information of the surface of the three-dimensional object.

In the above described embodiment, 3D data 35 in which mounting position 15 is formed on mounting target 12 is used; however, the present disclosure is not particularly limited thereto, and, for example, the three-dimensional shape data and a disposition pattern in which component P is disposed may be included in separate pieces of data.

In the above described embodiment, the operator inputs the designated position; however, the present disclosure is not particularly limited thereto, and the position on the surface of mounting target 12 may be acquired as the designation information based on the surface image included in 3D data 35. That is, control section 31 may automatically input the designated position by an image recognition of mounting position 15. In the device, the position on the surface of the three-dimensional object can be automatically designated from the 3D data.

In the above described embodiment, mounting system 10 includes mounting device 20 and information processing device 30; however, the present disclosure is not particularly limited thereto, and mounting device 20 may have a function of information processing device 30.

In the above described embodiment, the present disclosure has been described as information processing device 30; however, an information processing method may be applied. In the above described embodiment, the predetermined processing is described as the mounting processing for disposing component P; however, the present disclosure is not particularly limited thereto, and processing other than the mounting processing, for example, printing processing of an adhesive or a solder paste may be applied.

Here in the information processing device of the present disclosure, the control section may display the information display screen configured to display the information relating to the coordinate and the inclination of the surface obtained based on the 3D data. In the device, by checking the information display screen, it is possible to check the information of the position and the inclination on the surface of the three-dimensional object. The information display screen may be displayed inside a three-dimensional display screen or may be displayed outside the three-dimensional display screen.

In the information processing device of the present disclosure, the control section may acquire, as the designation information, the position on the surface of the processing target designated by the operator on the three-dimensional object display screen. In the device, the operator can designate the position on the three-dimensional object display screen. Alternatively, in the information processing device of the present disclosure, the control section may acquire the position on the surface of the processing target as the designation information based on the surface image included in the 3D data. In the device, the position on the surface of the three-dimensional object can be automatically designated from the 3D data.

In the information processing device of the present disclosure, when the position on the surface of the processing target on the three-dimensional object display screen is designated by the operator, the control section may display the plan view including the designated position using the plan view screen. In the device, it is easy to understand the designated position by the plan view screen. In the information processing device, the operator may further designate a position on the plan view screen. In the device, a more detailed position can be set on the plan view. The plan view screen may be displayed inside the three-dimensional display screen or may be displayed outside the three-dimensional display screen.

In the information processing device of the present disclosure, the processing device may be the mounting device configured to dispose the component at the arrangement position of the processing target based on the target mounting position information, and the control section may output, to the storage section, the information relating to the coordinate of the position corresponding to the designation information and the inclination of the surface as the arrangement position of the component, and may store the information as the target mounting position information. In the device, as the mounting device configured to dispose the component on the three-dimensional object, it is possible to more readily acquire the information of the arrangement position of the surface of the three-dimensional object.

An information processing method of the present disclosure is an information processing method used in a processing system including a processing device configured to perform predetermined processing on a three-dimensional processing target, the information processing method including steps of: (a) acquiring 3D data of the processing target; (b) displaying the processing target on a three-dimensional object display screen in a three-dimensional shape, being capable of moved, rotated, scaled up, and scaled down, based on the acquired 3D data; (c) acquiring designation information of a position on a surface of the processing target; and (d) outputting positional inclination information based on the 3D data, including information relating to a coordinate of the position and an inclination of the surface on the processing target corresponding to the acquired designation information.

In the method, similar to the above described information processing device, the positional inclination information of the designated position is output based on the 3D data, and thus the position information of the surface of the three-dimensional object can be more readily acquired. In the information processing method, various aspects of the above-described information processing device may be employed, or a configuration for realizing each function of the above-described information processing device may be added.

INDUSTRIAL APPLICABILITY

The information processing device and the information processing method of the present disclosure can be used in the technical field of a device configured to perform processing such as picking up and disposing of a processing target which is a three-dimensional object.

REFERENCE SIGNS LIST 10 mounting system, 12 mounting target, 13, 14 mounting surface, 15 mounting position, 20 mounting device, 21 control device, 22 target processing unit, 23 support section, 24 mounting processing unit, 25 pick-up section, 26 supply unit, 30 information processing device, 31 control section, 32 CPU, 33 storage section, 34 communication section, 35 3D data, 36 target mounting position database, 36a positional inclination information, 38 display, 39 input device, 40 three-dimensional object display screen, 41 cursor, 42 three-dimensional object display field, 43 cancel key, 44 confirmation key, 45 completion key, 50 information display screen, 60 plan view screen, P component.

The invention claimed is:

1. An information processing device configured to be used in a processing system including a mounting device configured to dispose a component on a three-dimensional processing target based on target mounting position information, the information processing device comprising:
processing circuitry configured to
acquire 3D data of the processing target, the processing target including multiple mounting surfaces;
display the processing target on a three-dimensional object display screen in a three-dimensional shape, which is capable of being moved, rotated, scaled up, and scaled down, based on the acquired 3D data;
acquire designation information of a mounting position on a selected mounting surface of the multiple mounting surfaces, the mounting position being a position on which the component is to be mounted;
output positional inclination information based on the 3D data, the positional inclination information including information relating to a coordinate of the mounting position and an inclination of the selected mounting surface of the processing target corresponding to the acquired designation information; and
output, to a storage section, the information relating to the coordinate of the mounting position and the inclination of the selected mounting surface, corresponding to the designation information, as the mounting position of the component, and stores the information as the target mounting position information.

2. The information processing device according to claim 1, wherein the three-dimensional object display screen includes an information display screen configured to display the information relating to the coordinate and the inclination of the selected mounting surface obtained based on the 3D data.

3. The information processing device according to claim 1, wherein the processing circuitry acquires, as the designation information, the mounting position on the selected mounting surface of the processing target designated by an operator on the three-dimensional object display screen.

4. The information processing device according to claim 1, wherein, when the mounting position on the selected mounting surface of the processing target on the three-dimensional object display screen is designated by an operator, the processing circuitry displays a plan view including the mounting position using a plan view screen.

5. An information processing method used in a processing system including a mounting device configured to dispose a component on a three-dimensional processing target based on target mounting position information, the information processing method comprising steps of:
(a) acquiring 3D data of the processing target, the processing target including multiple mounting surfaces;
(b) displaying the processing target on a three-dimensional object display screen in a three-dimensional shape, which is capable of being moved, rotated, scaled up, and scaled down, based on the acquired 3D data;
(c) acquiring designation information of a mounting position on a selected mounting surface of the multiple mounting surfaces, the mounting position being a position on which the component is to be mounted;
(d) outputting positional inclination information based on the 3D data, the positional inclination information including information relating to a coordinate of the mounting position and an inclination of the selected mounting surface of the processing target corresponding to the acquired designation information; and
(e) outputting, to a storage section, the information relating to the coordinate of the mounting position and the inclination of the selected mounting surface, corresponding to the designation information, as the mounting position of the component, and stores the information as the target mounting position information.

* * * * *